(12) United States Patent
Hara (10) Patent No.: US 8,248,175 B2
(45) Date of Patent: Aug. 21, 2012

(54) OSCILLATOR WITH EXTERNAL VOLTAGE CONTROL AND INTERPOLATIVE DIVIDER IN THE OUTPUT PATH

(75) Inventor: Susumu Hara, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 0 days.

(21) Appl. No.: 12/981,854

(22) Filed: Dec. 30, 2010

(65) Prior Publication Data

US 2012/0169387 A1  Jul. 5, 2012

(51) Int. Cl.
| | |
|---|---|
| *H03B 1/00* | (2006.01) |
| *H03B 5/00* | (2006.01) |
| *H03B 19/00* | (2006.01) |
| *H03L 7/00* | (2006.01) |
| *H03L 7/16* | (2006.01) |
| *H03L 7/18* | (2006.01) |

(52) U.S. Cl. ............................... 331/179; 331/16; 331/74

(58) Field of Classification Search ................ 331/16, 331/18, 25, 74, 177 R, 179
See application file for complete search history.

(56) References Cited

U.S. PATENT DOCUMENTS

| | | | |
|---|---|---|---|
| 5,777,524 A | 7/1998 | Wojewoda et al. | |
| 5,986,512 A | 11/1999 | Eriksson | |
| 6,236,703 B1 | 5/2001 | Riley | |
| 6,351,485 B1 | 2/2002 | Soe et al. | |
| 6,563,448 B1 | 5/2003 | Fontaine | |
| 6,674,824 B1 * | 1/2004 | Chiueh et al. | 375/376 |
| 6,703,901 B2 | 3/2004 | Jovenin et al. | |
| 6,972,635 B2 | 12/2005 | McCorquodale et al. | |
| 7,042,258 B2 | 5/2006 | Booth et al. | |
| 7,050,525 B2 | 5/2006 | Adachi et al. | |
| 7,068,110 B2 | 6/2006 | Frey et al. | |
| 7,181,180 B1 | 2/2007 | Teo et al. | |
| 7,271,666 B1 | 9/2007 | Melanson | |
| 7,345,549 B2 | 3/2008 | Xu | |
| 7,417,510 B2 | 8/2008 | Huang | |
| 7,839,225 B2 | 11/2010 | Huang | |
| 2004/0232995 A1 | 11/2004 | Thomsen et al. | |
| 2004/0247027 A1 | 12/2004 | Wang | |

(Continued)

FOREIGN PATENT DOCUMENTS

EP   0683558 A1   11/1995

(Continued)

OTHER PUBLICATIONS

Heng, Chun-Huat and Song, Bang-Sup, "A 1.8-GHz CMOS Fractional-N Frequency Synthesizers with Randomized Multiphase VCO," IEEE Journal of Solid-State Circuits, vol. 38, No. 6, Jun. 2003, 7 pages.

(Continued)

*Primary Examiner* — Levi Gannon
(74) *Attorney, Agent, or Firm* — Zagorin O'Brien Graham LLP (57) ABSTRACT

An oscillator output is controlled from an external voltage control terminal using an interpolative divider as a frequency modulator. The oscillator includes a reference clock generator, analog to digital converter, and an interpolative divider. Nominal output frequency is determined by the frequency of the reference clock and the nominal divide value of the interpolative divider. The divide value is changed according to the voltage control input value which is converted to a digital value via an analog to digital converter. Multiple interpolative dividers may be coupled to the single reference clock generator and each have a voltage control input and analog to digital converter.

20 Claims, 6 Drawing Sheets

U.S. PATENT DOCUMENTS

| | | |
|---|---|---|
| 2006/0139102 A1 | 6/2006 | Tucholski |
| 2008/0309420 A1 | 12/2008 | Fu et al. |
| 2010/0259333 A1 | 10/2010 | Fu et al. |
| 2011/0057693 A1 | 3/2011 | Huang |

FOREIGN PATENT DOCUMENTS

| | | |
|---|---|---|
| WO | 2004088846 A1 | 10/2004 |

OTHER PUBLICATIONS

Miletic, Igor and Mason, Ralph, "Bandwidth Expansion in Sigma-Delta PPLs Using Multiphase VCOs," IEEE Canadian Conference on Electrical and Computer Engineering, CCECE, May 2006, pp. 971-974.

U.S. App. No. 12/916,194, filed Oct. 29, 2010, entitled, "Voltage Controlled Oscillator with Dither," naming inventors Zhuo Fu and Susumu Hara.

Allen, Daniel J. and Carley, Adam L., "Free-Running Ring Frequency Synthesizer," 2006 IEEE International Solid-State Circuits Conference, Feb. 7, 2006, pp. 380-381.

Dai, Fa Foster et al., "A Direct Digital Frequency Synthesizer with Fourth-Order Phase Domain $\Delta\Sigma$ Noise Shaper and 12-bit Current-Steering DAC," IEEE Journal of Solid-State Circuits, vol. 41, No. 4, Apr. 2006, pp. 839-850.

Meninger, Scott E. and Perrott, Michael H., "A 1-MHZ Bandwidth 3.6-GHz 0.18-μm CMOS Fractional-N Synthesizer Utilizing a Hybrid PFD/DAC Structure for Reduced Broadband Phase Noise," IEEE Journal of Solid-State Circuits, vol. 41, No. 4, Apr. 2006, pp. 966-980.

Yang, Chin-Yuan et al., "A High-Frequency Phase-Compensation Fractional-N Frequency Synthesizer," IEEE International Symposium on Circuits and Systems, 2005 ISCAS, May 23-26, 2005, pp. 5091-5094.

* cited by examiner

OSCILLATOR WITH EXTERNAL VOLTAGE CONTROL AND INTERPOLATIVE DIVIDER IN THE OUTPUT PATH

FIELD OF THE INVENTION

This invention relates to generating clock signals for electronic devices and more particular to oscillators with external voltage control.

DESCRIPTION OF THE RELATED ART

Figure 1:
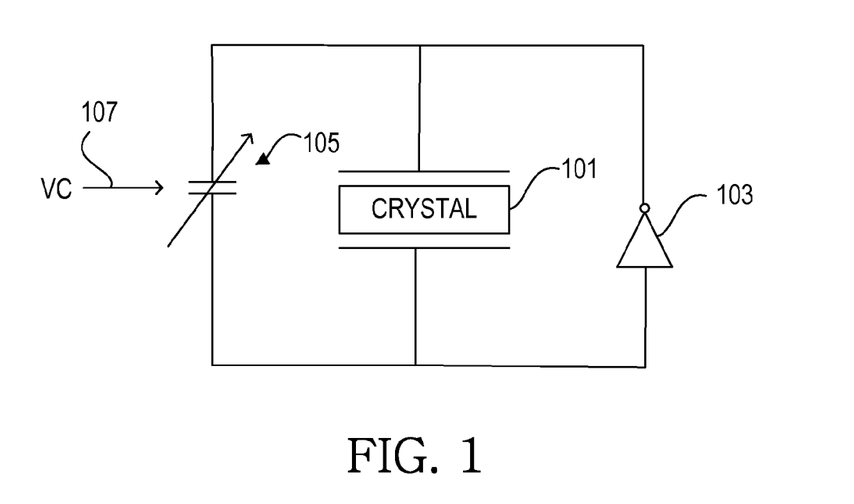
FIG. 1 illustrates a prior art VCXO implementation.

FIG. 1 illustrates a conventional voltage controlled crystal oscillator (VCXO). The VCXO allows the output frequency to be varied by changing a control input. The VCXO includes a crystal resonator 101, an amplifier 103, and a varactor 105 whose capacitance varies according to the voltage control (VC) signal supplied on node 107. In order to provide multiple VCXOs in a system, multiple crystal oscillators are required, which creates costs, size, and reliability issues.

Figure 2:
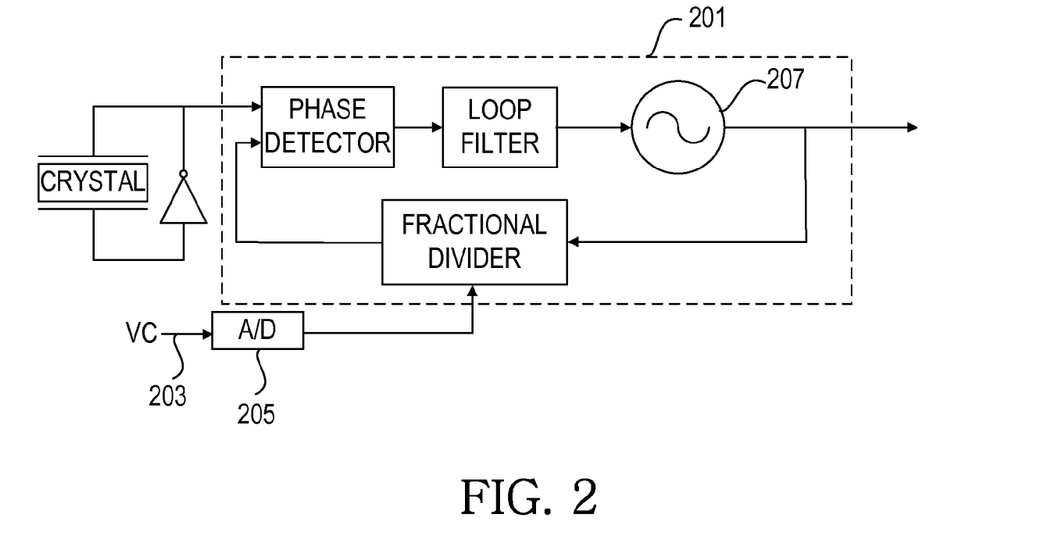
FIG. 2 illustrates a prior art approach to providing VCXO functionality.

Another approach to provide the functionality of a VCXO is shown in FIG. 2. A phase-locked loop 201 uses a fractional divider in the feedback loop. A VC input 203 is converted to a digital value in analog to digital converter 205. That value is used to adjust the feedback divider to modulate the output frequency of the PLL. The PLL 201 uses an LC oscillator 207. However, providing multiple VCXO functionality with such an approach is undesirable as it would require multiple PLLs with LC oscillators, which would take up considerable silicon area and power. Further, having multiple LC oscillators with close frequencies on the same die can result in crosstalk that would degrade the quality of the signals generated.

Accordingly, improvements in providing VCXO functionality is desirable.

SUMMARY

Accordingly, in one embodiment an apparatus is provided that includes a reference clock generator to generate a reference clock output signal. A first interpolative divider includes a divider, a delta sigma modulator, and a phase interpolator. The first interpolative divider is coupled to receive the reference clock output signal and to generate an interpolative divider output signal according to the reference clock output signal and a divide ratio. A first voltage control input terminal supplies a voltage control input signal. An analog to digital converter receives the voltage control input signal and supplies a digital voltage control signal. A circuit generates the divide ratio by arithmetically combining a nominal divide ratio of the interpolative divider and the digital voltage control signal.

The apparatus may further include a second interpolative divider that receives the reference clock output signal and generates a second interpolative divider output signal based on the reference clock output signal and a second divide ratio. A second voltage control input terminal supplies a second voltage control input signal and a second analog to digital converter receives the voltage control input signal and supplies a second digital voltage control. A second circuit generates the second divide ratio based on a second nominal divide ratio of the second interpolative divider and the second digital voltage control signal.

In another embodiment a method is provided that includes providing a signal with a reference frequency to an interpolative divider. A voltage control input signal is received on an input terminal. The voltage control input signal is converted to a digital voltage control signal in an analog to digital converter. A divide ratio is generated based on a nominal divide ratio and the digital voltage control signal and an interpolative divider output signal is generated having a frequency based on the reference frequency and the divide ratio.

The method may further include supplying a second interpolative divider with the signal with the reference frequency and receiving a second voltage control signal at a second input terminal. The second voltage control signal is converted to a second digital voltage control signal in a second digital to analog converter. A second divide ratio is generated based on a second nominal divide ratio and the second digital voltage control signal. A second interpolative divider output signal is generated from the second interpolative divider having a frequency based on the reference frequency and the second divide ratio.

In still another embodiment, an integrated circuit is provided that includes a plurality of interpolative dividers coupled to receive a clock signal and to generate a respective plurality of interpolative divider output signals, respective frequencies of the interpolative divider output signals being determined according to respective divide ratios of the respective interpolative dividers and a frequency of the clock signal. A plurality of voltage control input terminals receive respective voltage control input signals. A plurality of analog to digital converters are coupled to receive respective ones of the voltage control input signals and are coupled to respective interpolative dividers. The analog to digital converters generate respective digital voltage control signals. Respective arithmetic circuits generate the respective divide ratios based on the respective digital voltage control signals and respective nominal divide ratios.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 3:
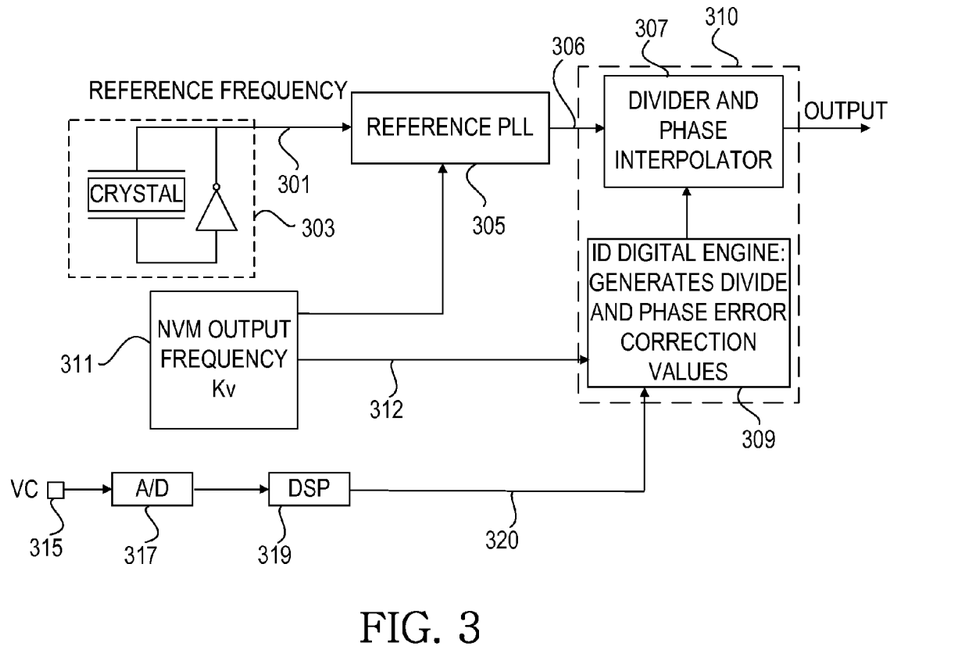
FIG. 3 illustrates an embodiment of the invention utilizing a crystal oscillator to provide a reference frequency for a PLL.

FIG. 3 illustrates an exemplary architecture of an oscillator having external voltage control of the output frequency according to an embodiment of the invention. A reference frequency signal is supplied on node 301 from a crystal oscillator 303. A phase-locked loop (PLL) 305 receives the reference frequency signal and generates a PLL output signal on node 306 that is supplied to the interpolative divider 310. The interpolative divider 310 includes a divider and phase interpolator 307 and control functionality 309, which generates divide and phase error correction values for the divider and phase interpolator 307, as described more fully herein. A non-volatile memory 311 supplies the reference PLL 305 with control signals. The control signals may control a feedback divider to control the output frequency of the PLL. The control signals may adjust the loop bandwidth of the PLL, control the sensitivity (Kv) of a voltage controlled oscillator (VCO) in the PLL, i.e., its tuning sensitivity, adjust input or output dividers, or otherwise affect PLL parameters based on the particular application. In addition, the non-volatile memory 311 supplies the interpolative divider (the control portion 309) with a nominal divide ratio on node 312. Thus, the illustrated embodiment achieves VCXO functionality using an interpolative divider as a frequency modulator. In another embodiment, a MEMS oscillator is used as oscillator 303 and a MEMS oscillator signal is supplied to the reference PLL. In still another embodiment a MEMs oscillator replaces both the crystal oscillator and the reference PLL.

In addition, an input terminal 315 receives an external voltage control signal and supplies the external voltage control signal to an analog to digital (A/D) converter block 317 that generates a digital representation of the analog voltage control signal. The A/D converter 317, which may be implemented as a delta sigma analog to digital converter, supplies the digital representation to a digital signal processing (DSP) 319. One function of DSP block 319 is low pass filtering, particularly if the A/D converter 317 is implemented as a delta sigma modulator. The DSP block 319 can also filter out spurs and/or other undesirable effects that may be generated during the analog to digital conversion or otherwise present in the digital voltage control signal according to the needs of the particular embodiment. The DSP supplies its output as a control signal to the interpolative divider control logic 309.

Figure 4:
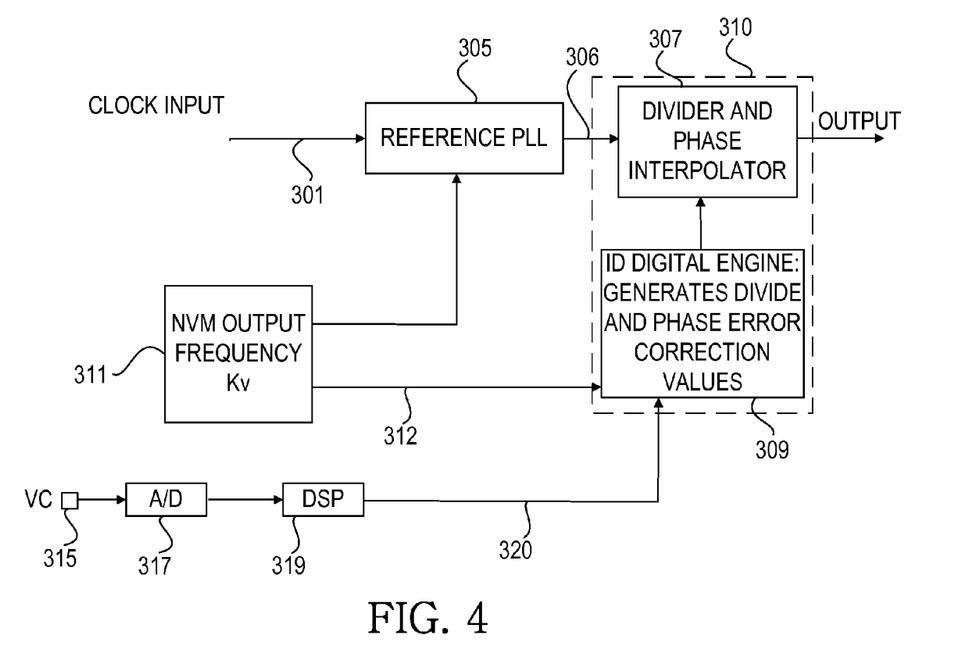
FIG. 4 illustrates an exemplary architecture of an embodiment in which the reference frequency for the PLL is supplied from a clock input.

FIG. 4 illustrates an exemplary architecture of an oscillator that provides external voltage control of the output frequency according to an embodiment of the invention in which the reference frequency supplied to the PLL 305 comes from a clock input signal. In an embodiment the crystal shown in FIG. 3 may reside in the same package with the integrated circuit containing the other functionality shown. In FIG. 4, the package terminal (pin or ball, etc.) may connect to a reference clock supplied from the printed circuit board (PCB) on which the voltage controlled oscillator is placed. Further, the reference frequency may come from MEMS oscillator rather than a crystal. In another embodiment, the reference PLL is omitted and a reference clock input is supplied directly to the interpolative divider.

Figure 5:
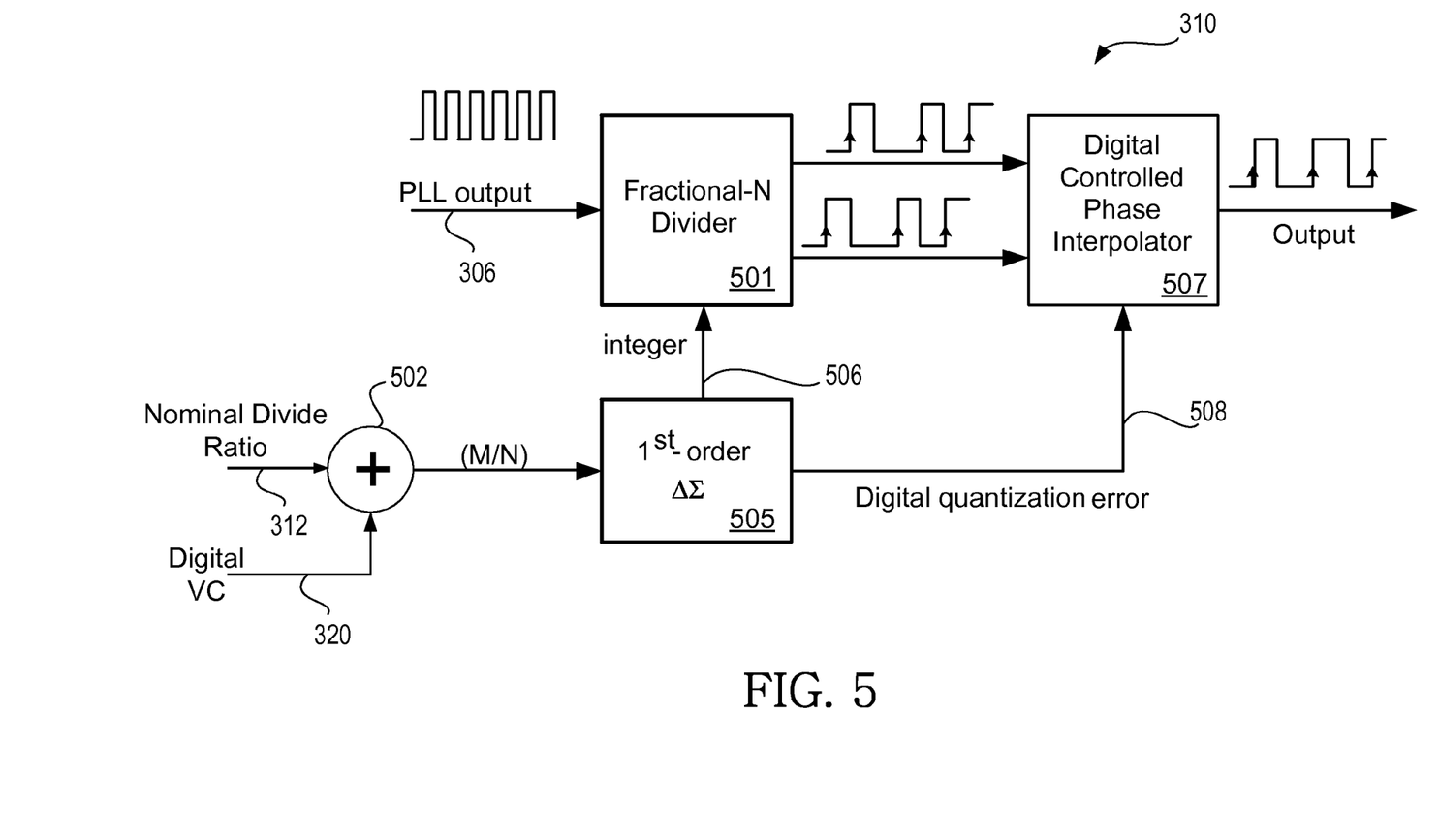
FIG. 5 illustrates an embodiment of an interpolative divider that may be used in embodiments of the invention.

Referring to FIG. 5, an exemplary interpolative divider is illustrated. The divider includes a fractional-N divider 501, which receives the PLL output 306. A first order delta sigma modulator 505 receives the digital divide ratio (M/N). That digital divide ratio supplied to DSM 505 may be adjusted by the digital voltage control signal supplied on node 320 from the DSP 319, e.g., in summer 502. Thus, the nominal divide ratio stored by the non-volatile memory 311 (see FIG. 3) is supplied to summer 502 along with the digital voltage control signal. In an exemplary embodiment, when the voltage at the VC pin is at midscale, the nominal divide ratio is supplied as M/N. Otherwise, the divide ratio M/N is adjusted up or down by arithmetically combining the nominal divide ratio and the digital voltage control signal in summer 502 to thereby adjust the output frequency of the interpolative divider according to the control voltage on the VC pin.

The integer portion of the digital divide ratio is supplied to the fractional-N divider 501 as divide control signal 506 in a stream of integers to approximate the actual divide ratio. The digital quantization error, corresponding to the fractional portion of the divide ratio, is supplied to the digitally controlled phase interpolator 507. The jitter introduced by the fractional-N divider 501 is canceled by interpolation in phase interpolator 507 based on the digital quantization error supplied by the delta sigma modulator 505. Thus, the PLL output is divided down by the fractional-N divider according to the control information provided by the delta sigma modulator 505. The phase interpolator 507 is used to cancel the quantization errors in the output of the fractional-N divider 501.

Figure 6:
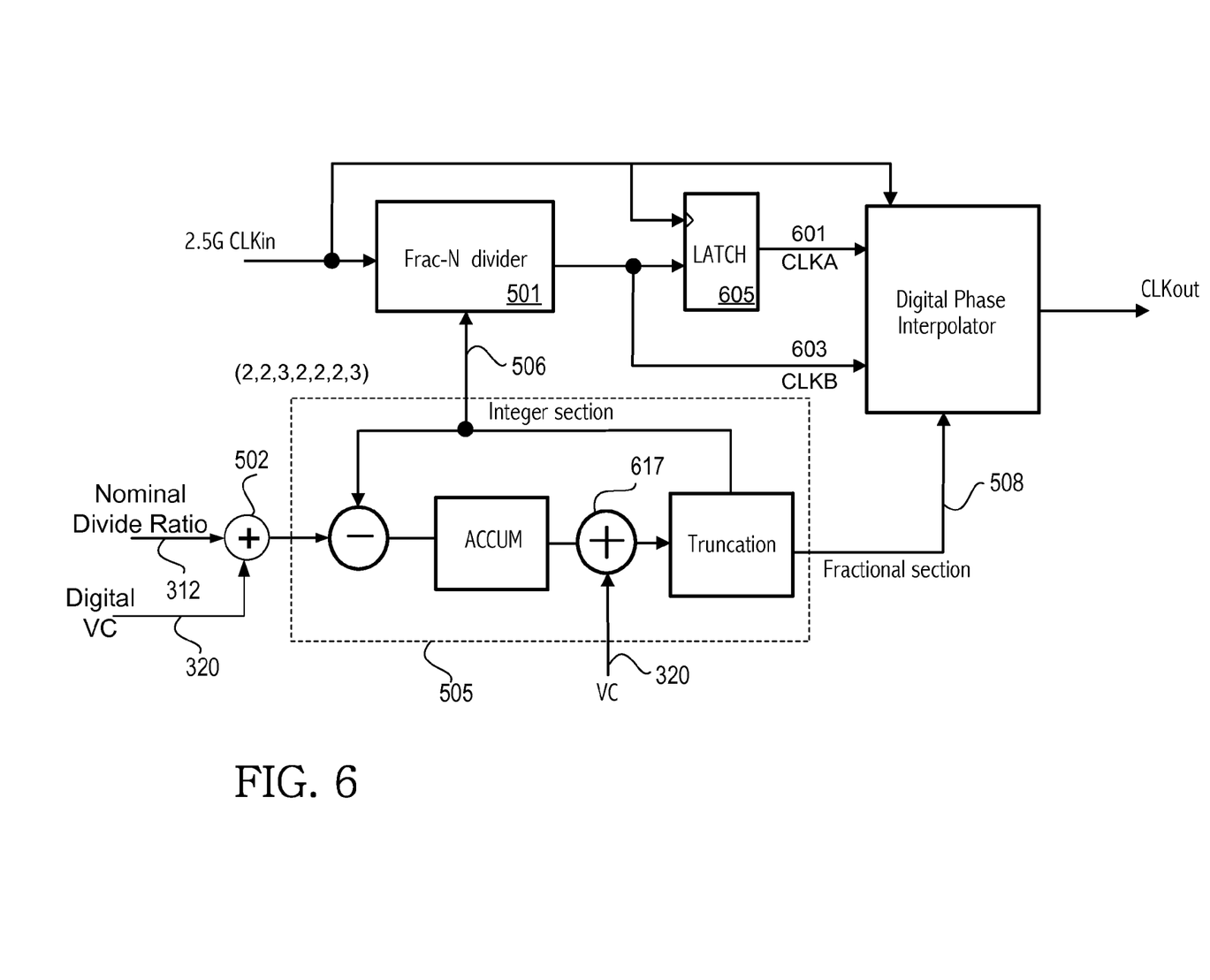
FIG. 6 illustrates additional details of an embodiment of an interpolative divider.

FIG. 6 shows additional details of the delta sigma modulator 505. In addition, an embodiment is shown in which the digital phase interpolator receives two signals 601 (CLKA) and 603 (CLKB) to interpolate. The signal 603 is supplied from the fractional-N divider 501. Latch 605 also receives the output 603 from the fractional-N divider and supplies the signal 601 to the digital phase interpolator. The latch delays the output of the divider by one-half clock period of the VCO allowing the interpolator to interpolate between those two signals.

Figure 7:
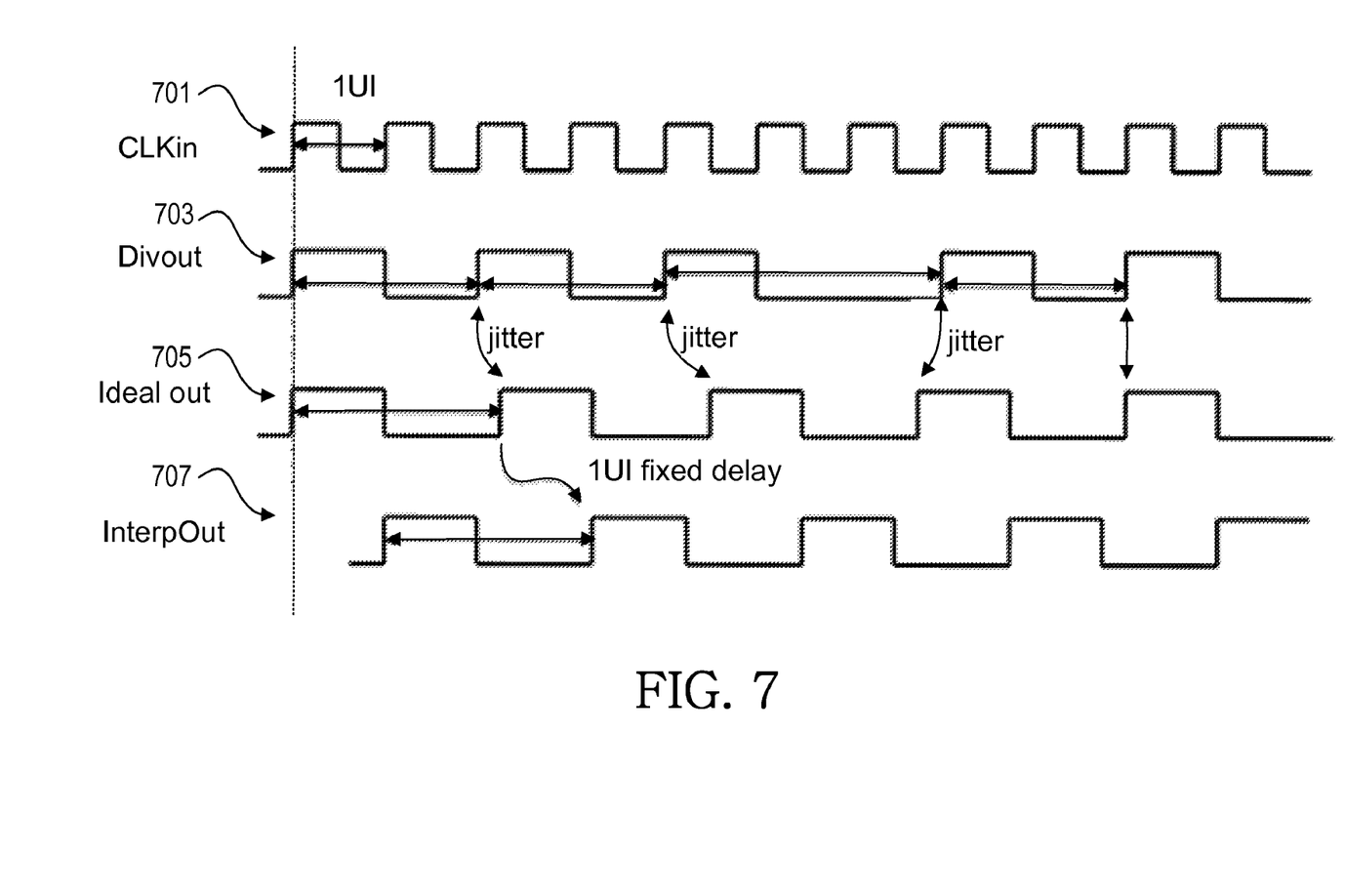
FIG. 7 illustrates a timing chart of an exemplary interpolation operation.

FIG. 7 illustrates operation of the interpolator for a divide by 2.25. The PLL supplies the CLKin shown in waveform 701. The fractional-N divider receives a stream of divide values of 2, 2, 2, 3, 2, 2, 2, 3, . . . , which results in a divider output (Divout) shown as waveform 703. The ideal waveform is shown as ideal out 705. By interpolating between the signals 601 and 603 based on the quantization error 508 supplied by the sigma delta modulator, an interpolator output signal is shown with the jitter removed. Additional details about the interpolative divider including the phase interpolator can be found in U.S. Pat. No. 7,417,510, issued Aug. 26, 2008, entitled "Direct Digital Interpolative Synthesis", naming Yunteng Huang as inventor, which application is incorporated herein by reference.

Figure 8:
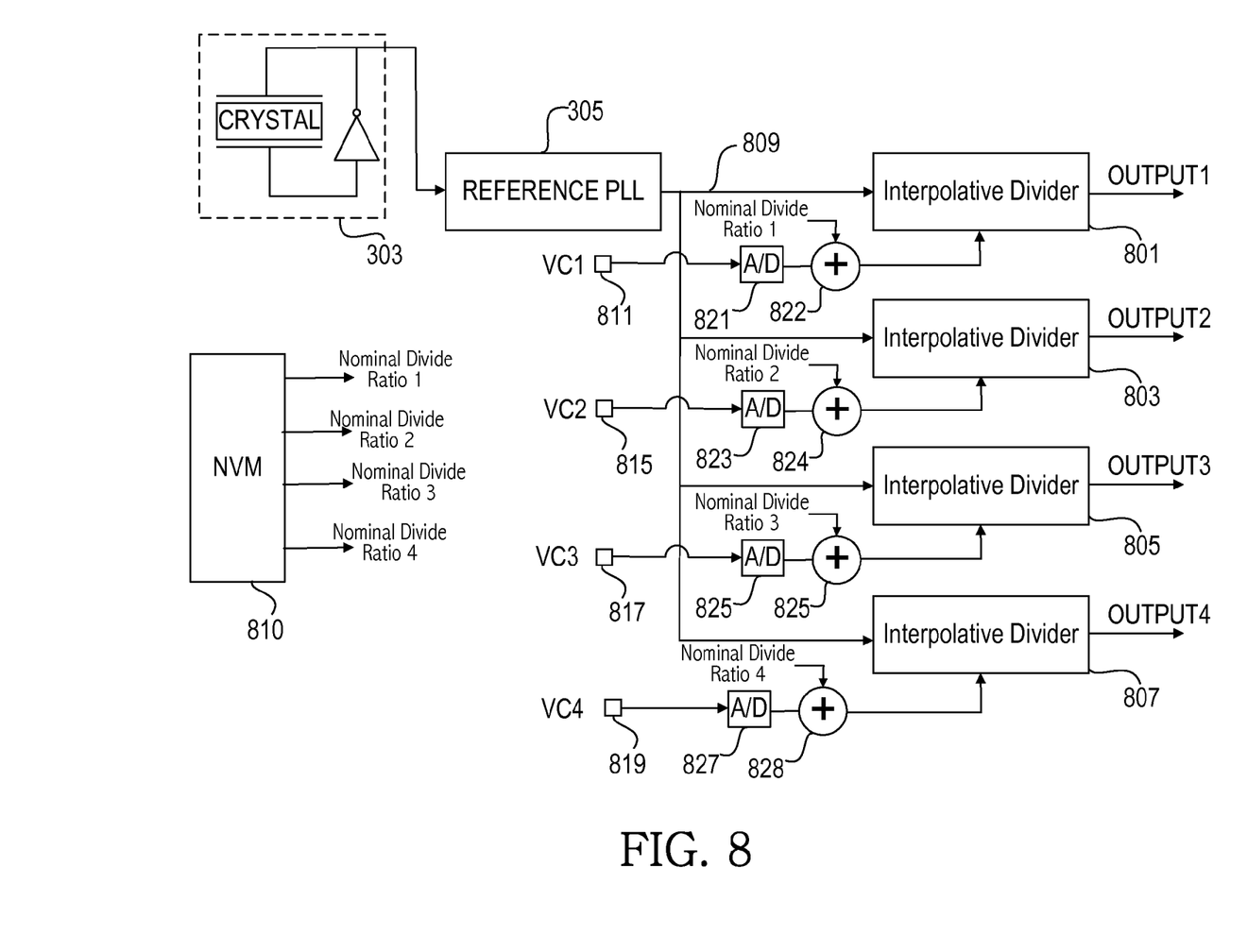
FIG. 8 illustrates an embodiment of the invention incorporating multiple interpolative dividers to generate multiple independent outputs that are varied using multiple independent voltage control inputs.

FIG. 8 illustrates a particular advantage of the architecture shown in FIGS. 3 and 4 utilizing an interpolative divider such as the one illustrated in FIGS. 5-7. In FIG. 8, the crystal oscillator 303 supplies the reference PLL 305 with a reference clock signal. The reference PLL 305 supplies a plurality of interpolative dividers 801, 803, 805, and 807 with the PLL output signal on node 809. In addition, voltage control signals VC1, VC2, VC3, and VC4 are provided to input terminals 811, 815, 817, and 819, which in turn supply analog to digital converters 821, 823, 825, and 827. A non volatile memory (NVM) 810 supplies the nominal divide ratios for each of the interpolative dividers. The analog to digital converters convert the voltage supplied on the input terminals to a digital value that is combined with the nominal divide ratios in summers 822, 824, 826, and 828 to generate the divide ratios for the interpolative dividers. The output frequencies are determined by the divide ratios and the frequency of the reference clock signal. Thus, the outputs OUT1, OUT2, OUT3, and OUT4 are independently controlled by their respective VC input terminals, A/Ds and interpolative dividers. The outputs are typically provided to a printed circuit board for use by other system components.

By utilizing a single reference clock signal generator, e.g., the PLL 305, and interpolative dividers as frequency modulators, a small silicon area can be achieved. In addition, the reference PLL can be simpler and smaller than what is needed for a PLL used in FIG. 2. The reference PLL can be simpler for multiple reasons. For example, the divide ratio of the PLL does not need to be fractional and does not need to be changed on-the-fly. A simple integer divider can be used. Additionally, the frequency range of the PLL's VCO can be chosen without any constraints from the output frequencies allowing VCO design to be simpler. The advantage of smaller size is very significant when multiple VCXO functionality is needed. Instead of having a PLL for each controlled output, one PLL is used for multiple independently controlled outputs as shown in FIG. 8. The approach described herein is also suitable for small geometry CMOS processes. The multiple independently controlled outputs described in FIG. 8 provide low noise and no crosstalk as compared to prior art solutions where multiple LC oscillators could be running at similar frequencies.

While the number of independently controlled output signals may vary according to system requirements, one embodiment provides multiple interpolative dividers coupled to a single PLL as shown in FIG. 8. For those applications requiring fewer outputs, the unused interpolative dividers may be powered off to reduce power consumption by independently controlled switches (not shown in FIG. 8) that can be controlled, e.g., from the nonvolatile memory 311.

In addition, as with the embodiments described earlier, the crystal oscillator 303 may be a MEMS oscillator instead. In addition, a MEMS oscillator may replace the crystal oscillator 303 and reference PLL 305. The output of the MEMS oscillator should be able to achieve a suitable reference frequency for the signal supplied to the interpolative dividers, which is achieved in other embodiments using a fixed frequency source and a PLL. In still another embodiment, the signal supplied on node 809 is supplied from an input terminal.

The description of the invention set forth herein is illustrative, and is not intended to limit the scope of the invention as set forth in the following claims. For example. Variations and modifications of the embodiments disclosed herein, may be made based on the description set forth herein, without departing from the scope of the invention as set forth in the following claims.

What is claimed is:

1. An apparatus comprising:
    a reference clock generator to generate a reference clock output signal;
    a first interpolative divider including a divider, a delta sigma modulator, and a phase interpolator, the first interpolative divider coupled to receive the reference clock output signal and to generate an interpolative divider output signal according to the reference clock output signal and a divide ratio;
    a first voltage control input terminal to supply a voltage control input signal;
    an analog to digital converter coupled to receive the voltage control input signal and supply a digital voltage control signal; and
    a circuit to arithmetically combine a nominal divide ratio of the interpolative divider and the digital voltage control signal to generate the divide ratio.

2. The apparatus as recited in claim 1 further comprising:
    comprising a phase-locked loop operable as the reference clock generator and coupled to receive a reference signal and supply the reference clock output signal; and
    a fixed frequency source coupled to supply the reference signal to the reference clock generator.

3. The apparatus as recited in claim 2 wherein the fixed frequency source of the reference signal is one of a crystal oscillator and a MEMS oscillator.

4. The apparatus as recited in claim 1 further wherein the reference clock generator is a MEMS oscillator.

5. The apparatus as recited in claim 1 wherein the circuit is a summer circuit to arithmetically combine the nominal divide ratio of the interpolative divider and the digital voltage control signal to generate the divide ratio.

6. The apparatus as recited in claim 1 further comprising a memory coupled to supply a control signal to control a frequency of the reference clock output signal generated by the reference clock generator.

7. The apparatus as recited in claim 1 further comprising a memory coupled to supply the nominal divide ratio to determine a nominal frequency of the interpolative divider output signal.

8. The apparatus as recited in claim 1 further comprising:
    a second interpolative divider coupled to receive the reference clock output signal and to generate a second interpolative divider output signal based on the reference clock output signal and a second divide ratio;
    a second voltage control input terminal to supply a second voltage control input signal;
    a second analog to digital converter coupled to receive the second voltage control input signal and to supply a second digital voltage control signal; and
    a second circuit to generate the second divide ratio based on a second nominal divide ratio of the second interpolative divider and the second digital voltage control signal, to thereby adjust a frequency of the second interpolative divider output signal according to the second voltage control input signal.

9. The apparatus as recited in claim 8 further comprising a memory coupled to supply the second nominal divide ratio.

10. A method comprising:
    providing a signal with a reference frequency to an interpolative divider;
    receiving a voltage control input signal on an input terminal;
    converting the voltage control input signal to a digital voltage control signal in an analog to digital converter;
    generating a divide ratio based on a nominal divide ratio and the digital voltage control signal; and
    generating an interpolative divider output signal having a frequency based on the reference frequency and the divide ratio.

11. The method as recited in claim 10 further comprising:
    receiving a reference signal at a phase-locked loop from a fixed frequency source; and
    generating the signal with the reference frequency in the phase-locked loop based on the reference signal.

12. The method as recited in claim 11 supplying the reference signal from one of a crystal oscillator and a MEMS oscillator.

13. The method as recited in claim 11 further comprising supplying the signal with the reference frequency from a phase-locked loop.

14. The method as recited in claim 11 further comprising supplying from a nonvolatile memory the nominal divide ratio that determines a nominal frequency of the interpolative divider output signal.

15. The method as recited in claim 10 further comprising:
    supplying a second interpolative divider with the signal with the reference frequency;
    receiving a second voltage control signal at a second input terminal;
    converting the second voltage control signal a second digital voltage control signal in a second digital to analog converter;

generating a second divide ratio based on a second nominal divide ratio and the second digital voltage control signal; and generating a second interpolative divider output signal from the second interpolative divider having a frequency based on the reference frequency and the second divide ratio.

16. The method as recited in claim 15 further comprising supplying the second nominal divide ratio to determine a second nominal frequency of the second interpolative divider output signal.

17. The method as recited in claim 16 further comprising determining the second divide ratio of the second interpolative divider by summing the second digital voltage control signal and the second nominal divide ratio.

18. An integrated circuit comprising:

a plurality of interpolative dividers coupled to receive a clock signal and to generate a respective plurality of interpolative divider output signals, respective frequencies of the interpolative divider output signals being determined according to respective divide ratios of the respective interpolative dividers and a frequency of the clock signal;

a plurality of voltage control input terminals to receive respective voltage control input signals;

a plurality analog to digital converters coupled to receive respective ones of the voltage control input signals and coupled to respective interpolative dividers, the analog to digital converters to generate respective digital voltage control signals; and respective arithmetic circuits to generate the respective divide ratios based on the respective digital voltage control signals and respective nominal divide ratios.

19. The integrated circuit as recited in claim 18 further comprising a phase-locked loop (PLL) coupled to receive a reference signal and supply the clock signal.

20. The integrated circuit as recited in claim 18 further comprising a memory to supply the respective nominal divide ratios for the plurality of interpolative dividers.

* * * * *

UNITED STATES PATENT AND TRADEMARK OFFICE
CERTIFICATE OF CORRECTION

| | |
|---|---|
| PATENT NO. | : 8,248,175 B2 |
| APPLICATION NO. | : 12/981854 |
| DATED | : August 21, 2012 |
| INVENTOR(S) | : Susumu Hara |

It is certified that error appears in the above-identified patent and that said Letters Patent is hereby corrected as shown below:

In the Claims

In column 8, line 6, please insert --of-- after "plurality".

Signed and Sealed this
Eighteenth Day of March, 2014

Michelle K. Lee
*Deputy Director of the United States Patent and Trademark Office*